United States Patent [19]

White

[11] Patent Number: 5,001,773

[45] Date of Patent: Mar. 19, 1991

[54] LOCAL OSCILLATOR FEEDTHRU CANCELLATION CIRCUIT

[75] Inventor: Charles R. White, Los Angeles, Calif.

[73] Assignee: Hughes Aircraft Company, Los Angeles, Calif.

[21] Appl. No.: 209,241

[22] Filed: Jun. 20, 1988

[51] Int. Cl.$^5$ .......................... H04B 1/04; H04B 15/06
[52] U.S. Cl. ...................................... 455/118; 455/126; 455/317
[58] Field of Search ................................. 455/118–120, 455/207, 208, 209, 256, 263, 214, 304, 317, 318, 319, 125–126

[56] References Cited

U.S. PATENT DOCUMENTS

| | | | |
|---|---|---|---|
| 4,355,420 | 10/1982 | Ishihara | 455/317 |
| 4,584,710 | 4/1986 | Hansen | 455/304 |
| 4,593,411 | 6/1986 | Schiller | 455/118 |

Primary Examiner—Reinhard J. Eisenzopf
Assistant Examiner—Lisa Charouel
Attorney, Agent, or Firm—Leonard A. Alkov; W. K. Denson-Low

[57] ABSTRACT

Method and apparatus are disclosed for canceling local oscillator feed thru in an IF transmission circuit. The apparatus includes first and second mixers for receiving LO and IF signals. The mixers are operable to upconvert the IF signal while passing an attenuated and phase shifted portion of the LO signal. Bias regulation circuitry is provided for regulating the attenuation and phase shift of the LO signal portion passed by at least one of the mixers such that the LO signal portions are combinable to cancel each other. A coupler circuit is provided for combining the mixer outputs such that the LO signal portions are substantially canceled and an upconverted IF signal remains. The bias regulation circuitry may be self-correcting to optimize cancellation of the LO signal portions.

17 Claims, 3 Drawing Sheets

LOCAL OSCILLATOR FEEDTHRU CANCELLATION CIRCUIT

BACKGROUND OF THE INVENTION

The present invention relates to a circuit for eliminating interference with an IF information signal. More particularly, the invention relates to a circuit for canceling the feed thru of a local oscillation (LO) signal to an IF signal path.

In conventional IF transmission circuits the IF signal is upconverted by mixing with an LO signal to form the signal to be transmitted. The signal to be transmitted is preferably characterized by two lobes, or sidebands, centered about the LO frequency. Ideally, the LO signal does not feed thru the mixer and does not appear in the output signal However, it is common for the LO signal to not only feed through to the mixer output (as a third lobe intermediate to the sidebands), but to be the largest amplitude component of the transmitted signal. For certain applications it is desirable to limit the transmitted signal to the information component excluding extraneous components. One advantage of such a limitation is to reduce the susceptibility of transmitted signals to interception and destructive interference. Where the LO feed thru signal amplitude exceeds the amplitude of the side lobes, interception of the transmit signal may be accomplished by identifying the LO feed thru components and concentrating on the frequency range about the LO feed thru signal. Consequently, the presence of the LO feed thru signal, as a component of the transmitted signal, renders a transmitted signal significantly more susceptible to identification and interference. The present invention is directed to a method and circuitry for reducing the ability of a receiver to identify and interfere with a transmitted signal by removing the appearance of the LO signal component from the transmitted signal.

There are a number of contemporary circuits that operate to actively remove the LO signal component from the output signal. One such circuit is disclosed in an article titled *Circuit for Cancelling Local Oscillator Leakage Through Mixers*, by Ron Minarik, Microwave Journal, p. 182-186, July 1985. That article discloses a circuit wherein a portion of the LO signal is tapped, phase shifted and attenuated by manual adjustments so as to be of equal amplitude and opposite phase in relation to the fed thru LO signal. The phase shifted and attenuated LO signal is then combined with the output signal so as to cancel the fed thru LO signal component from the output signal.

Another contemporary circuit designed to perform a related function is set forth in the *Anaren Microwave Components Catalog*, 17A, p. 158 (1985). The circuit disclosed therein operates to prevent jamming of a nearby receiver by cancelling the undesired component of the transmitted signal. The circuit achieves cancellation by tapping a portion of the transmitter signal, comparing it to the received signal, and actively cancelling the transmitter signal by adjusting the amplitude and phase.

Though these and other contemporary systems provide means for canceling an undesired LO signal component from a composite signal, the method and circuitry for performing that function have limitations and cost penalties which make their use impractical for many applications. Manually adjusted compensation circuits, such as that disclosed in the article titled *Circuit for Cancelling Local Oscillator Leakage Through Mixers* fail to provide automatic closed loop control to consistently perform compensation without constant manual adjustment. Changes in temperature and other conditions effect LO feed thru such that the output signal must be continuously monitored and the correct compensation signal must be continuously updated. Other circuits, such as that disclosed in the *Anaren Microwave Components Catalog*, require utilization of expensive circuit components which render such compensation circuits unsuitable for many applications.

In view of these and other deficiencies in contemporay compensation circuits, the present invention is intended to provide an alternate, cost effective circuit and method for canceling LO feed thru. The present invention provides a highly effective circuit wherein LO signal feed thru be reduced by as much as 60-70 dB. The cancellation signal may be adaptive to automatically respond to changes in temperature and other evnirornmental conditions that will affect the nature of the fed thru signal. In addition, the circuit utilizes inexpensive available components to perform the cancellation. As described below the invention simultaneously forms its two composite signals having both IF and LO feed thru components with the LO feed thru components being canceling. The combination of the two signals eliminates LO feed thru to the output signal.

SUMMARY OF THE INVENTION

Method and apparatus are disclosed for canceling local oscillator feed thru in an IF transmission circuit. The apparatus includes first and second mixers for receiving LO and IF signals. The mixers are operable to upconvert the IF signal while passing an attenuated and phase shifted portion of the LO signal. Mixer bias regulation circuitry is provided for controlling the attenuation and phase shift of the LO signal portion passed by the upconverter mixers such that the LO signal portions are combinable to cancel each other. A coupler circuit is provided for combining the mixer outputs such that the LO signal portions are substantially canceled and an upconverted IF signal remains. The bias regulation circuitry may be self-correcting to optimize cancellation of the LO signal portions.

Phase shift and attenuation of the LO signal portions is affected such that the LO signal portions are of substantially identical amplitude and of opposing phase. Such regulation of attenuation and phase shifting may be accomplished by regulating the operation of one or both of the mixers, and may be facilitated by the use of a phase shifting coupler. In the illustrated embodiment a 90 degree coupler is utilized such that the relative phase shift between LO signal portions output from the mixers need only be 90 degrees.

Also in the presently preferred embodiment bias regulation is accomplished by feeding back a portion of the output of the coupler circuit through a pair of synchronous detectors operative to generate a DC signal, useful for bias regulation, in response to the detection of an LO signal portion in the output signal. Selective regulation of the bias signal will vary both the attenuation and the phase shift of the LO signal portion.

DETAILED DESCRIPTION OF THE PRESENTLY PREFERRED EMBODIMENT

The detailed description set forth below is intended merely as a description of the presently preferred embodiment of the invention, and is not intended to represent the only form in which the present invention may be constructed or utilized The description below sets forth the functions and sequence of signals that are effected by the invention in connection with the illustrated embodiment. It is to be understood, however, that the same, or equivalent functions or signal sequences may be accomplished by different embodiments that are also intended to be encompassed within the spirt and scope of the invention.

As described in more detail below, the present invention operates to mix IF and LO signals to generate a pair of composite signals, each including an upconverted IF signal and an LO feed thru component. The composite signals are characterized in that the IF signal components are in phase while the LO feed thru components are out of phase. The phase and attenuation of the LO components is adjustable such that the LO feed thru components are canceling. The combination of the two composite signals therefore removes the fed thru LO signal component from the output signal. In the presently preferred embodiment the LO and IF signals are combined in a dual balance mixer, the bias of which may be adjusted to modify the attenuation and phase shifting of the LO feed thru component. That bias adjustment may be accomplished manually or by control circuitry, in a closed loop system, wherein the control circuity functions to vary the bias adjustment in response to the presence of the fed thru LO component.

Figure 1:
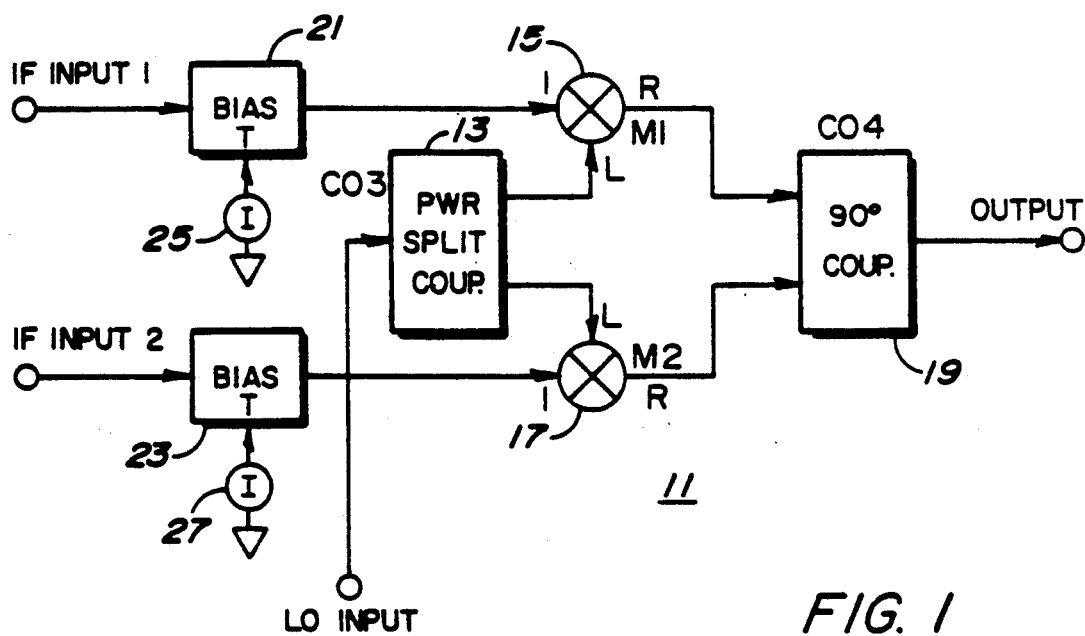
FIG. 1 is a schematic diagram of a local oscillator feed thru cancellation circuit in accordance with the present invention.

FIG. 1 illustrates an exemplary embodiment of a local oscillator feed thru cancellation circuit in accordance with the present invention. The circuit 11 is used to actively cancel an LO feed thru signal by means of amplitude and phase balancing of the coupling network. As described below the unwanted LO feed thru signal and a coupled LO signal are actively matched in opposing amplitude and phase, and then combined in a coupler to cancel the LO feed thru signal.

The circuit 11 consists of a power splitting coupler 13 for receiving and splitting an LO signal used to upconvert one or more IF signals. FIG. 1 illustrates two IF input signals, IF input 1 and IF input 2. The IF input signals are communicated to mixers M1 and M2 where they are combined with the LO input signal to upconvert the IF signal. Bias regulation circuits 21 and 23 are disposed in the IF signal path to mixers M1 and M2. Bias regulation circuits 21 and 23 operate to selectively pass current from current sources 25 and 27 to mixers 15 and 17. By regulating the current to mixers 15 and 17 the amplitude and phase of the LO feed thru signal output from the mixers can be regulated. The outputs from mixers 15 and 17 are combined in 90 degree coupler 19, with the resulting signal output from coupler 19.

In practice, mixers 15 and 17 may be formed as dual balanced mixers. One characteristic of such mixers is that they phase shift and attenuate the LO signal passing through the mixer, but not the IF signal. By selective adjustment of one or both of the bias regulation circuits 21 and 23 the proper canceling relationship can be obtained between the LO feed thru signal output from mixer 15 and the LO feed thru signal output from mixer 17. The desired canceling relationship is that two feed thru signals output from mixers 15 and 17 be of equal and opposite amplitude, and out of phase. Phase cancellation may be accomplished entirely by the mixers or may be partially accomplished by the mixers and partially by a phase shifting coupler (as illustrated at FIG. 1). In the illustrated embodiment phase cancellation is effected by effecting a 90 degree phase difference in the outputs from mixers 15 and 17, and effecting an additional 90 degree phase difference through coupler 19. The 90 degree coupler 19 operates to phase shift one of the inputs to the coupler by 90 degrees. Accordingly, the desired phase regulation of mixers 15 and 17 is such as to obtain a 90 degree phase shift between LO feed thru signals output from the mixers. The remaining 90 degree phase shift is obtained by virtue of the operation of coupler 19.

As will be apparent to one of ordinary skill in the art the invention is not limited to regulation of mixer circuits to provide a particular phase difference in respective outputs. Any phase difference in respective output signals may be useable to implement the present invention so long as the remaining circuitry operates to supplement the phase shift such that the two LO feed thru signals are canceling.

The embodiment illustrated at FIG. 1 contemplates the use of two IF input signals. However, it is to be understood that the circuit may operate with a single IF input signal, with the second IF input port terminated in a resistive load. Consequently, both single channel and multiple channel operation may be implemented through the use of the present invention. It is also to be understood that although the embodiment at FIG. 1 illustrates two bias regulation circuits, a single bias regulation circuit may be used. However, the use of two bias regulation circuits has been found to be more effective in closely regulating the relative phase and amplitude of the signals output from the mixers.

Figure 2:
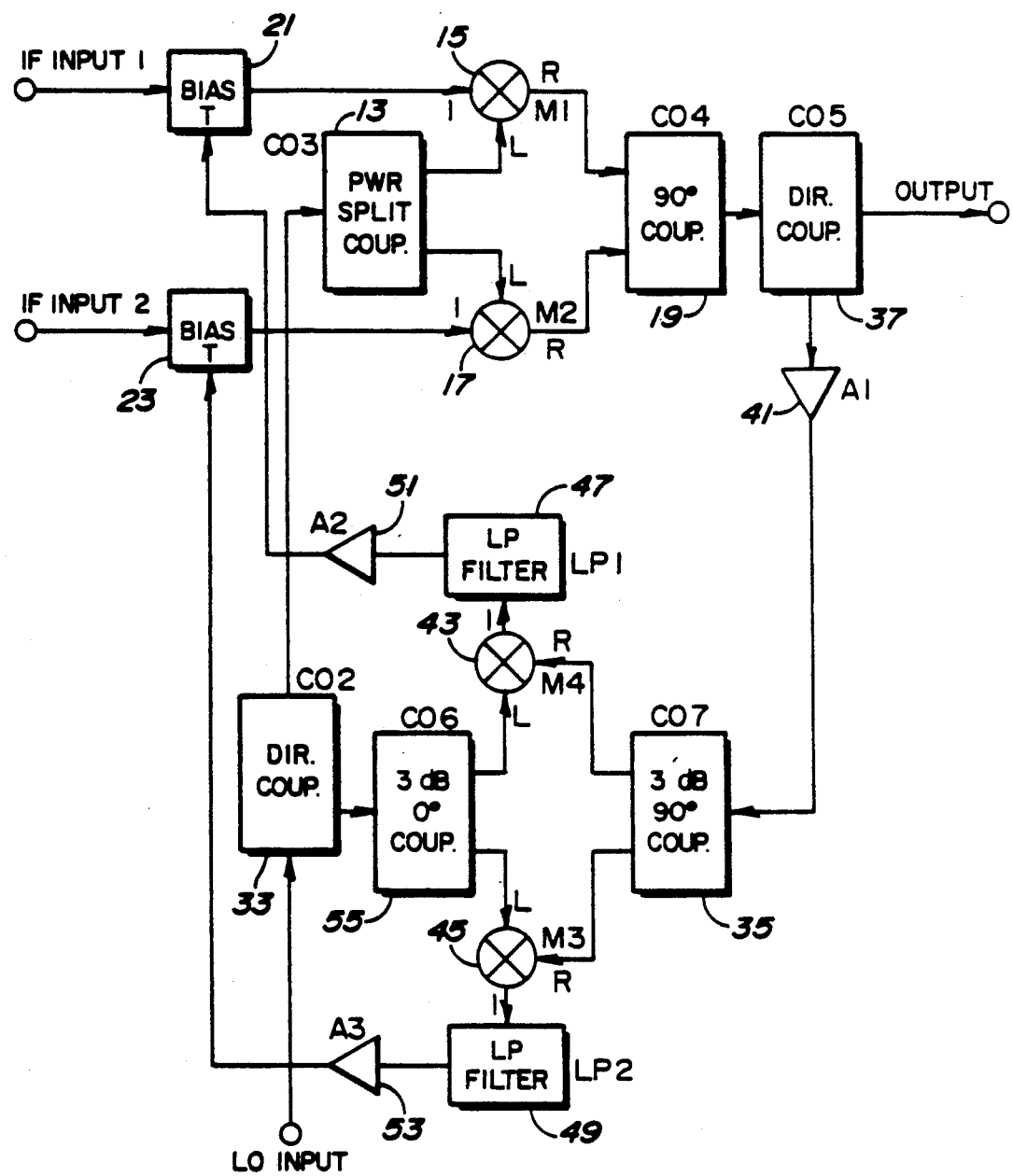
FIG. 2 is a schematic diagram of the circuit as illustrated in FIG. 1 further including automatic bias and attenuation adjustment circuitry.

FIG. 2 illustrates an LO feed thru cancellation circuit 31, similar to that set forth at FIG. 1, with additional circuitry for automatically adjusting the operation of bias regulation circuits 21 and 23. The circuit 31 includes a coupler 33 interposed between the LO input source and the coupler 13. Circuit 31 also includes coupler 35 which receives a signal representative of the output from coupler 19, via coupler 37 and amplifier 41. Mixers 43 and 45 receive signals from couplers 35 and 55, and act as synchronous detectors to generate DC regulation signals via low pass filters 47, 49 and amplifiers 51 and 53. The DC regulation signals function to regulate the operation of bias control circuits 21, 23 by adjusting the bias signals communicated to the mixers to obtain LO phase and amplitude cancellation. The DC regulation signals are representative of the difference between the LO signal from coupler 33 and the LO signal from coupler 35. Consequently, the mixers 43 and 45 operate to generate signals used to regulate the operation of mixers 15 and 17 such that the LO feed thru signal is actively reduced.

Figure 3:
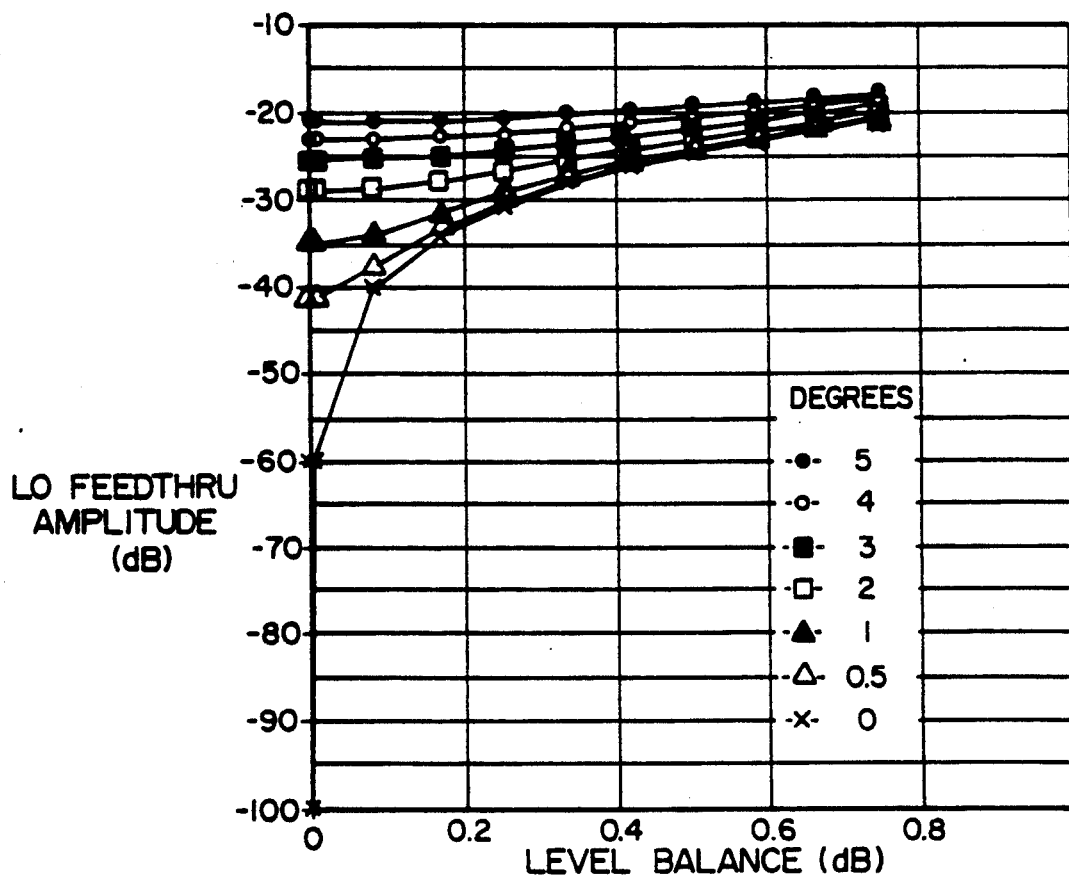
FIG. 3 is a chart illustrating an LO feed thru cancellation to be expected from a given amplitude balance and phase match effected by the circuit in FIG. 1.

FIG. 3 is a chart illustrating the LO feed thru cancellation that is to be expected using the present invention, from a given amplitude balance and phase match. The X axis represents the amplitude balance of the LO signal components output from mixers 15 and 17, and the different plots represents the accuracy of the canceling phase match obtained by the circuitry including mixers 15, 17 and coupler 19. The Y axis represents the level of LO feed thru cancellation that is obtainable given the amplitude balance and phase match. As shown at FIG. 3 LO feed thru cancellation in the range of 60-100 dB is obtainable where the amplitude balance approaches 0 dB and the phase difference is 0 degrees. Approximately a 40 dB reduction of the LO feed thru signal amplitude occurs at a 0.5 degree phase imbalance, with approximately zero amplitude imbalance.

As shown at FIG. 3 high levels of LO feed thru cancellation can be obtainable by the present circuit where the phase and amplitude imbalances approach zero.

Figure 4:
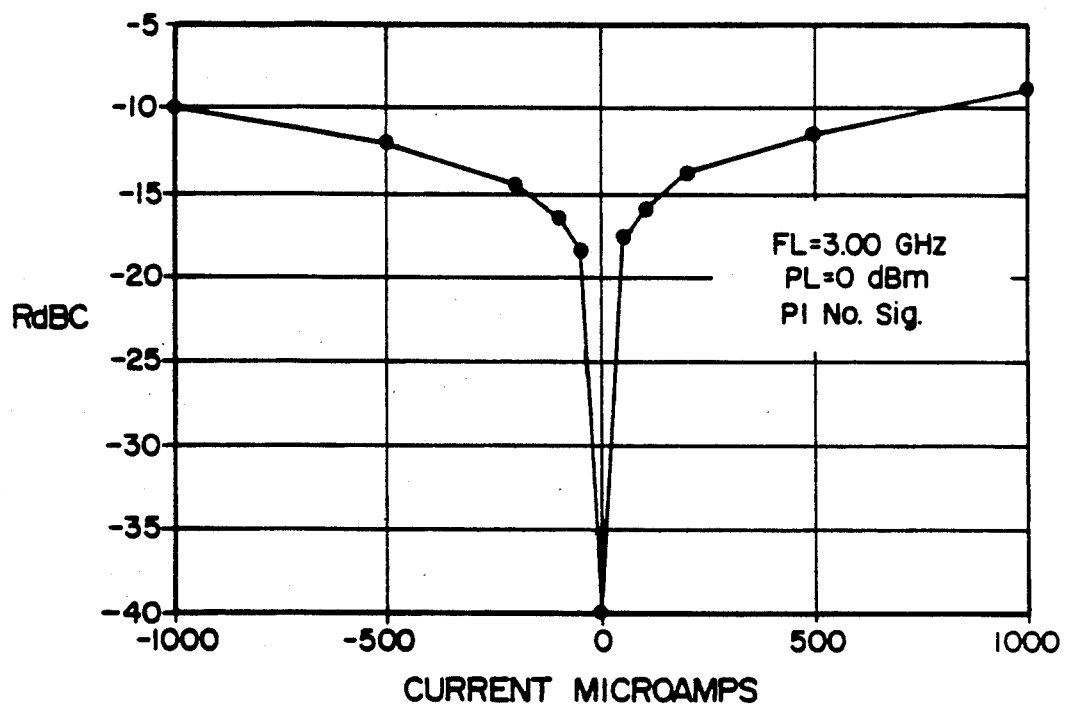
FIG. 4 is a graph showing the reduction in LO feed thru signal amplitude, or L to R port isolation, (in dBs) in relation to the injected bias current that occurs in a double-balanced mixer.

FIG. 4 is a graph showing the reduction in LO feed thru signal amplitude, or L to R port isolation, (in dBs) in relation to the injected bias current that occurs in a double-balanced mixer.

Figure 5:
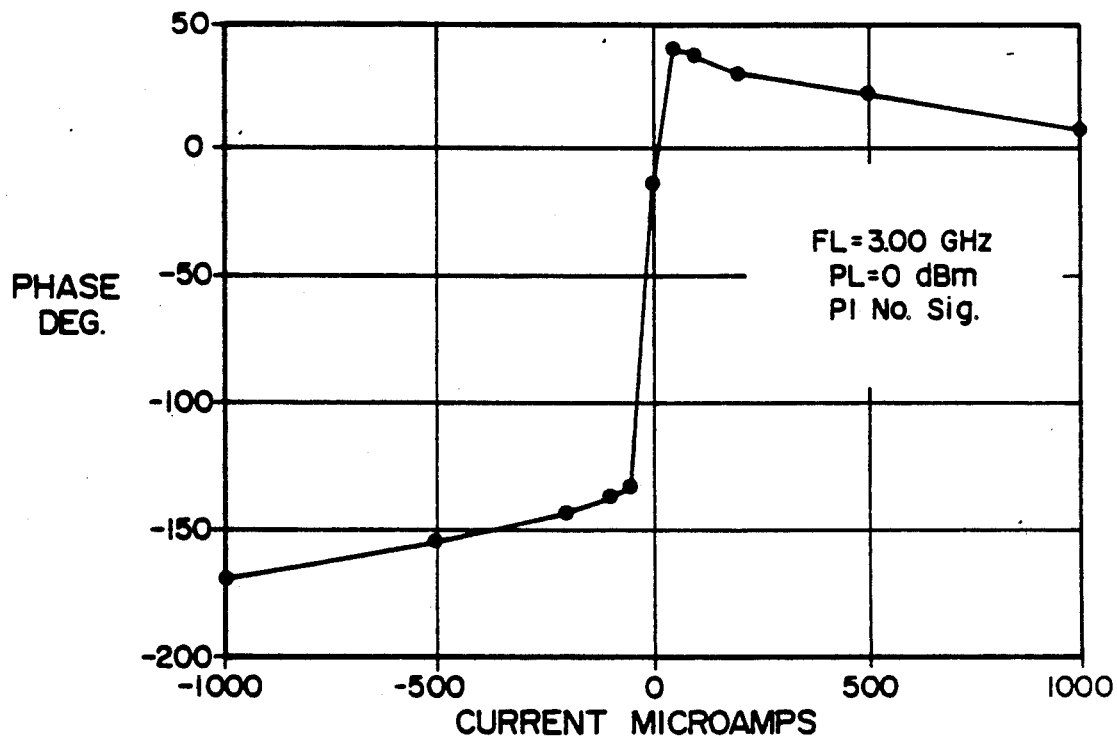
FIG. 5 is a graph showing the phase change of the LO feed thru signal (in degrees) in relation to the injected bias current that occurs in a double-balanced mixer.

FIG. 5 is a graph showing the phase change of the LO feed thru signal (in degrees) in relation to the injected bias current that occurs in a double-balanced mixer. The measurements used to create FIGS. 4 and 5 were made with the frequency of the LO signal being 3 GHz. The power input to the mixer through the L port was approximately 0 dBm representing the lower limit of the usable drive for the mixer. No RF conversion signal was applied to the I port of the mixer. The I port was essentially open with current injected through an 18.2K resistor.

FIGS. 4 and 5 demonstrate how injected bias current changes phase and amplitude of an LO signal applied to the mixer. The phase change generally measured approximately 207 degrees over a range of bias currents from −1 to +1 ma. The greatest phase slope appeared to occur close to zero injected bias current. The zero bias current also appeared to be in the operating region where the feed thru amplitude null occurs. Consequently, from the amplitude and phase versus frequency plots, the most widely varying amplitude and phase characteristics occurred close to zero injected bias. Variation in I port terminations; short, open and 50 ohm terminations, cause some changes at lower frequencies, but did not significantly influence the responses above 2 GHz.

As previously discussed various modifications, additions and substitutions may be effected to implement the structure and function of the component portions without departing from the spirit and scope of the invention. For example, other circuitry for effecting control of the bias regulation circuitry may be implemented within the scope of the invention. Additionally, it is anticipated that cancellation of the LO signal portions may be effected in different ways, through the use of different components.

What is claimed is:

1. A local oscillator (LO) feedthru cancellation circuit in an IF transmitter comprising:
first and second mixers, each of said mixers having a first input L port for receiving an LO input signal and a second input I port for receiving an IF input signal in said transmitter;
said first and second mixers with each mixer being operable to upconvert a received IF signal and each of said mixers output a composite signal comprising an upconverted IF signal and portion of the received LO signal, at least one of said LO signal portions being attenuated and phase shifted in relation to the received LO input signal;
bias regulation circuitry for generating a variable bias signal for applying to the I port of at least one of said mixers for regulating the attenuation and phase shifting of at least one of said LO signal portions such that the LO signal portions are combinable to cancel each other wherein said bias regulation circuitry is connected to both of said first and second mixers to regulate the attenuation and phase shifting of the LO signal portions output from both of said mixers; and
a coupler circuit in said transmitter connected to said first and second mixers for combining said mixer outputs such that said LO signal portions are substantially canceled and said upconverted IF signal is output from said coupler circuit.

2. The circuit as recited in claim 1 wherein said bias regulation circuitry further comprises feedback control circuitry for varying said bias signal in response to a detected presence of an LO signal portion in the coupler circuit output.

3. The circuit as recited in claim 2 wherein said feedback control circuitry comprises a synchronous detector circuit for controlling said bias signal.

4. The circuit as recited in claim 1 wherein said bias regulation circuitry regulates the attenuation of an LO signal portions output from both said first and second mixers.

5. The circuit as recited in claim 1 wherein the bias regulation circuitry regulates the phase shifting of LO signal portions output from both said first and second mixers.

6. The circuit as recited in claim 1 wherein the bias regulation circuitry regulates attenuation of the LO signal portion output from said first mixer to be substantially identical to the attenuation of the LO signal portion output from said second mixer.

7. The circuit as recited in claim 1 wherein said bias regulation circuitry regulates the phase shift of the LO signal portion output from said first mixer to be approximately 90 degrees out of phase in relation to the LO signal portion output from said second mixer.

8. The circuit as recited in claim 1 wherein said coupler circuit comprises phase shifting circuitry to shift the phase of the LO signal portion received from said first mixer by 90 degrees.

9. The circuit as recited in claim 1 wherein each of said first and second mixers is operative to phase shift a portion of said received LO signal without shifting the phase of the received IF signal.

10. A local oscillator (LO) feedthru cancellation circuit in said transmitter, comprising:
a first mixer having a first input L port for receiving an LO input signal and a second input I port for receiving an IF input signal, said first mixer being operable to upconvert the received IF signal and to output a composite signal comprising an upconverted IF signal and a first portion of the received LO signal, said LO signal first portion being attenuated and phase shifted in relation to the received LO input signal;

a second mixer having a first input port for receiving the LO input signal, in said transmitter, said second mixer being operable to output a signal comprising a second portion of the received LO signal, said LO signal second portion being attenuated and phase shifted in relation to the received LO input in relation to the received LO input signal;

bias regulation circuitry in said transmitter for generating a variable bias signal for applying to the I port of at least one of said first and second mixers for regulating the amplitude and phase of at least one of said LO signal first and second portions, such that said LO signal first and second portions are combinable to cancel each other wherein said bias regulation circuitry is connected to the respective I ports of both of said first and second mixers to regulate attenuation and phase shift of both of said LO signal first and second portions; and a coupler circuit in said transmitter connected to said first and second mixers for combining outputs of said first and second mixers such that said mixers such that said LO signal first and second portions are substantially canceled and said upconverted IF signal remains.

11. The circuit as recited in claim 10 wherein said bias regulation circuitry further comprises feedback control circuitry for varying said bias signal in response to a detected presence of an LO signal portion in the coupler circuit output.

12. The circuit as recited in claim 11 wherein each of said first and second mixers is operative to phase shift a portion of said LO signal without shifting the phase of the received IF signal.

13. A method of canceling local oscillator feedthru in a transmitter comprising:

providing an LO signal to respective L ports to each of a pair of mixers;

providing an IF signal in said transmitter to respective I ports of at least one of the pair of mixers, each of the mixers being operable to upconvert a received IF signal and to pass a portion of the received LO signal, said LO signal portion being attenuated and phase shifted in relation to the received LO signal;

adjusting the phase shift and attenuation of said LO signal portions generating a variable bias signal and providing said variable bias signals to the respective I ports of said mixers such that such LO signal portions are combinable to cancel each other;

combining the outputs of said first and second mixers such that the LO signal portions are substantially canceled and the upconverted IF signal remains and detecting the presence of a remaining LO signal portion after the output from respective I ports of said first and second mixers are combined regulating the variable bias signal such that the remaining LO signal portion is substantially eliminated.

14. The method as recited in claim 13 wherein an IF signal is provided to at least one of the first and second mixers.

15. The method as recited in claim 14 wherein the step of regulating the variable bias signal comprises generating a DC regulation signals representative of the remaining LO signal portion and regulating the variable bias signal provided to the I ports of each of said mixers in response to said DC regulation signal.

16. The method as recited in claim 15 wherein said step of regulating the variable bias signal is effected to vary the attenuation of the LO signal portion output from at least one of said mixers.

17. The method as recited in claim 16 wherein said step of regulating the variable bias signal is effected to vary the phase shift of the LO signal portion output from the R port of at least one of said mixers.

* * * * *